(12) United States Patent
Huebner et al.

(10) Patent No.: US 8,879,671 B2
(45) Date of Patent: Nov. 4, 2014

(54) WORKER AND ITERATION CONTROL FOR PARALLEL TURBO DECODER

(75) Inventors: Axel Huebner, Munich (DE); Jens Berkmann, Munich (DE); Maria Fresia, Munich (DE); Armin Hautle, Dachau (DE)

(73) Assignee: Intel Mobile Communications GmbH, Neubiberg (DE)

( * ) Notice: Subject to any disclaimer, the term of this patent is extended or adjusted under 35 U.S.C. 154(b) by 167 days.

(21) Appl. No.: 13/599,943

(22) Filed: Aug. 30, 2012

(65) Prior Publication Data

US 2014/0064413 A1 Mar. 6, 2014

(51) Int. Cl.
*H04L 27/06* (2006.01)

(52) U.S. Cl.
USPC ......................................... 375/340

(58) Field of Classification Search
CPC .............. H04L 1/005; H03M 13/2948; H03M 13/3972; H03M 13/3746
USPC .......... 375/262, 265, 340–341; 714/755, 786, 714/792, 795
See application file for complete search history.

(56) References Cited

U.S. PATENT DOCUMENTS

| | | | | |
|---|---|---|---|---|
| 7,669,105 B2 * | 2/2010 | Pisek et al. | ..................... | 714/755 |
| 7,895,497 B2 * | 2/2011 | Pisek et al. | ..................... | 714/755 |
| 8,488,701 B2 * | 7/2013 | Loh et al. | ...................... | 375/260 |
| 8,594,217 B2 * | 11/2013 | Fanous et al. | ................. | 375/262 |
| 2002/0174401 A1 * | 11/2002 | Wang et al. | ................... | 714/786 |

OTHER PUBLICATIONS

C. Berrou, A. Glavieux, P. Thitimajshima, Near Shannon limit error-correcting coding and decoding: Turbo codes, in Proc. of the IEEE International Conference on Communication, May 1993, pp. 1064-1070, Geneva, Switzerland.
O. Muller, A. Baghdadi, and M. Jezequel, From Parallelism Levels to a Multi-ASIP Architecture for Turbo Decoding, IEEE Transactions on Very Large Scale Integration (VLSI) Systems, Jan. 2009, pp. 92-102, vol. 17, No. 1.
3GPP TS 36.212 V10.3.0, 3rd Generation Partnership Project; Technical Specification Group Radio Access Network; Evolved Universal Terrestrial Radio Access (E-UTRA); Multiplexing and channel coding (Release 10), Sep. 2011, 79 pages.
3GPP TS 25.212 V8.5.0, 3rd Generation Partnership Project; Technical Specification Group Radio Access Network; Multiplexing and channel coding (FDD) (Release 8), Mar. 2009, 107 pages.

* cited by examiner

*Primary Examiner* — Khanh C Tran

(57) ABSTRACT

A device such as a worker, window-size and iteration control unit (WWICU) is proposed. The WWICU determines processing, iteration, and window information based on format information indicative of one or more formats to be processed by a decoding process. The processing information may include a number of parallel workers, the iteration information may include a number of half-iterations, and the window information may include a window size to be used in the decoding process. The WWICU then determines time information including a total cycle count based on the processing information, the iteration information, and the window information. In response to determining that the total cycle count is not beyond a threshold value, the WWICU may transmit configuration information including the processing, iteration, and window information to a device, such as a turbo decoding device, configurable to perform the decoding process based on the configuration information.

20 Claims, 7 Drawing Sheets

| FORMAT INFORMATION 320 | PROCESSING INFORMATION 322 | ITERATION INFORMATION 324 | WINDOW INFORMATION 326 | OTHER INFORMATION 328 |
|---|---|---|---|---|
| $F_1$ | $P_1$ | $I_1$ | $W_1$ | $K_1, C_1$ |
| $F_2$ | $P_2$ | $I_2$ | $W_2$ | $K_2, C_2$ |
| $F_3$ | $P_3$ | $I_3$ | $W_3$ | $K_3, C_3$ |
| $F_4$ | $P_4$ | $I_4$ | $W_4$ | $K_4, C_4$ |
| $F_n$ | $P_n$ | $I_n$ | $W_n$ | $K_n, C_n$ |

WORKER AND ITERATION CONTROL FOR PARALLEL TURBO DECODER

BACKGROUND

With the promulgation of mobile communications, the rate at which devices process data has increased significantly, leading to significant increases in the required throughput of these devices. In an attempt to meet these throughput requirements, turbo decoders (as used in air interfaces like Long Term Evolution (LTE), High-Speed Downlink Packet Access (HSDPA), Time Division Synchronous Code Division Multiple Access (TD-SCDMA) which receive and decode data are typically realized by splitting an input block into several sub-blocks and processing them in parallel.

However, increasing the parallelism of the decoding process may result in performance degradations in terms of block error rate (BLER) or user data throughput (user-Tput) (e.g., the rate of received and acknowledged bits per second) through the introduction of errors at the boundaries of the sub-blocks, which may be significant depending on the code block size and the degree of parallelism. Another performance relevant parameter is the number of half-iterations of the decoding process. Increasing the number of half-iterations of the decoding process may result in an improved BLER or user-Tput, but also in an increase in processing time. Furthermore, increasing the window size of the decoding process, which is typically necessary for higher code rates, may also result in an improved BLER or user-Tput which comes at the expense of an increased processing time.

SUMMARY

Some features described herein relate generally to structures and processes that may optimize decoding device parameters for a particular real-time throughput requirement. In some instances, adaptively adjusting these factors based on the instantaneous data packet(s) to be decoded may lead to significant user-Tput improvements while maintaining the real-time decoding requirements (e.g., maximum allowable decoding latency). Decoding device parameters may include, for example, the number of half-iterations, the window size, and other parameters used in an iterative decoding process. In some aspects, decoding device parameters may include the number of parallel workers (e.g., processing devices such as processors) when a parallel decoding process is used.

In some aspects, a worker, window-size and iteration control unit (WWICU) may be capable of configuring the decoding device parameters to process one or more data packets corresponding to one or more different formats within a predetermined time interval based on a particular real-time throughput requirement (e.g., user-Tput, decoding latency requirement, cycle-count requirement). In one example, the decoding device may receive a small data packet that may allow for an increased number of half-iterations which may improve user-throughput and BLER performance. In addition, if the decoding process is a parallel decoding process, the small data packet may allow for a decreased number of parallel workers, which may also improve user-throughput and BLER performance, because higher degrees of parallelism may not be necessary for small packets.

According to some aspects, a WWICU is provided that is communicatively coupled to a decoding device configurable to perform a decoding process based on the configuration information to process one or more data packets respectively corresponding to one or more formats. The WWICU may include a processor and memory for determining iteration information and window information based on format information indicative of the one or more formats to be processed by a decoding process of the decoding device. The iteration information may include a number of half-iterations to be used in the decoding process. The window information may include a window size to be used in the decoding process. Subsequently, the WWICU may determine time information based on the iteration information and the window information. The time information may include, for example, a total cycle count (e.g., in hardware cycles) for the decoding process.

In some arrangements, the WWICU may compare the total cycle count to a threshold value, such as a maximum total cycle count based on the real-time throughput requirements of the decoding process. The WWICU may determine whether the total cycle count is beyond the threshold value and, if not, transmit configuration information to a device, such as the decoding device, configurable to perform the decoding process based on the configuration information. The configuration information may include, for example, the iteration information and the window information determined by the WWICU.

In some arrangements, the WWICU may further determine processing information based on the format information. The processing information may include a number of parallel workers to be used in a parallel decoding process. In certain implementations, the number of parallel workers of the decoding device may be chosen to be equal to 1 (e.g., no parallelism). Subsequently, the WWICU may determine the time information based on the processing information, the iteration information, and the window information. The WWICU may transmit configuration information to a device, such as a decoding device, configurable to perform the decoding process based on the configuration information. The configuration information may include, for example, the processing information, the iteration information, and the window information determined by the WWICU.

This summary is not intended to identify critical or essential features of the disclosures herein, but instead merely summarizes certain features and variations thereof. Other details and features will also be described in the sections that follow.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein:

FIG. 3 illustrates example information for use in configuring a decoding device;

DETAILED DESCRIPTION

The devices and/or software described herein may be implemented using one or more processors, integrated circuits (ICs) such as application specific integrated circuits (ASICs), programmable logic devices (PLDs) such as field programmable gate arrays (FPGAs), storage devices (e.g., memory), circuit boards such as printed circuit boards (PCBs), executable instructions, software, and other hardware and/or software elements and combinations thereof. For example, executable instructions and data used by processors and other components may be stored in memory, in hardware logic, or in any other storage device. Memory may include any of various types of tangible machine-readable storage medium, including one or more of the following types of storage devices: read only memory (ROM) modules, random access memory (RAM) modules, magnetic tape, magnetic discs (e.g., a hard disk drive), optical discs (e.g., a CD-ROM disc, a CD-RW disc, a DVD disc), flash memories, phase-change memories, EEPROM memories, and other volatile and non-volatile memories. Software may be stored within memory to provide instructions to the processors and other components such that when the instructions are executed, the processor or other component may be caused to perform the various functions or methods described herein, function as the various devices described herein, or both. Software may include both applications and operating system software, and may include code segments, instructions (e.g., computer readable instructions, computer executable instructions), precompiled code, compiled code, computer programs, program modules, engines, program logic, and combinations thereof. For example, software may include the decoding process described herein.

The devices and/or components described herein may include one or more communication devices and may be communicatively coupled through one or more communication links Communication devices may include, for example, communication interfaces, filters, amplifiers, splitters, wave guides, transmitters, receivers, transceivers, and other wired or wireless components. Communication links may include, for example, wired communication links such as electrically conductive wires and optical fibers and wireless communication links such as radio frequency (RF) communication links, infrared (IR) communication links, microwave communication links, acoustic communication links, and wireless communication network links (e.g., Wi-Fi).

Figure 1:
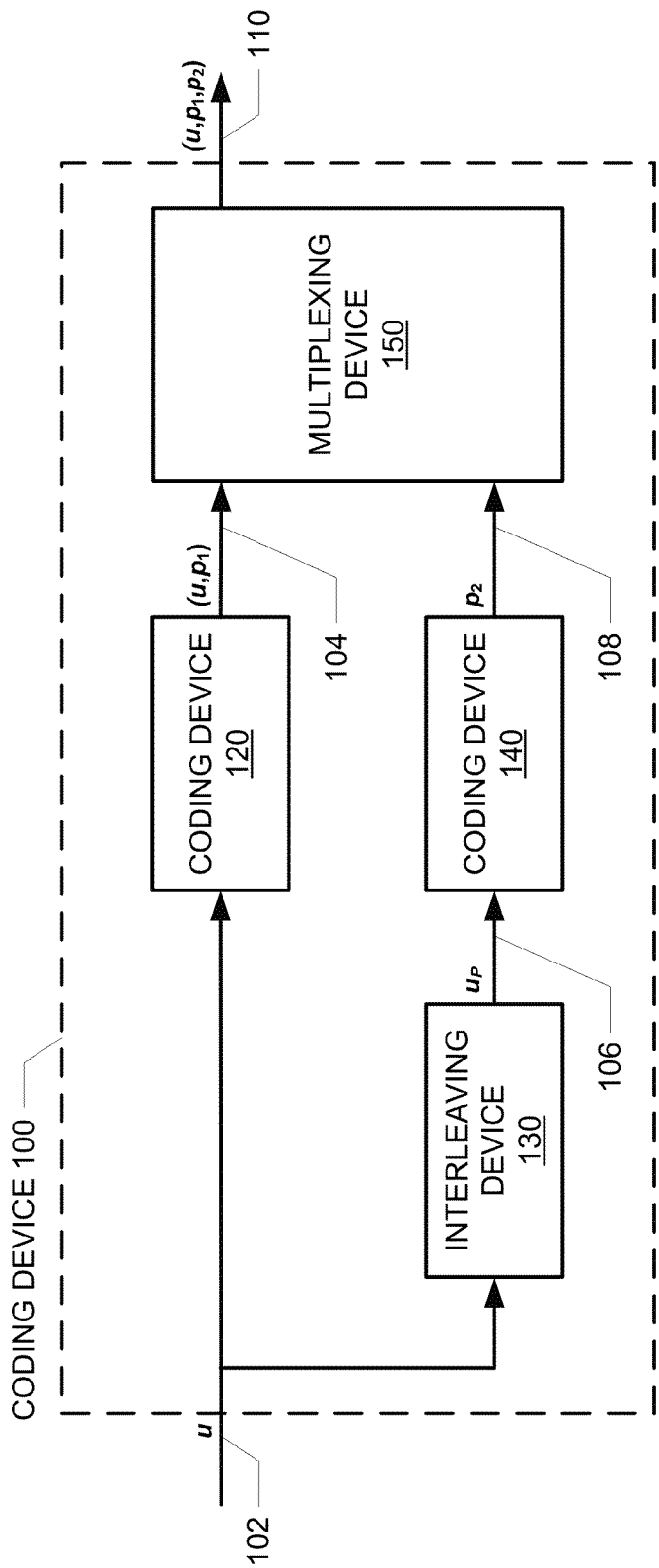
FIG. 1 illustrates an example coding device.

FIG. 1 illustrates an example coding device 100 for coding an information sequence in accordance with one or more aspects described herein. Coding device 100 may be, for example, a turbo coder included in or communicatively coupled to a wireless transmitter of a computing device (e.g., mobile phone, tablet computer, vehicular computing system, or any other device or combination of devices). In some aspects, coding device 100 may include more or less components than those illustrated in FIG. 1. In some aspects, the physical arrangement of the components of coding device 100 may differ from FIG. 1. It will be understood that the features described herein are not limited to parallel-concatenated codes (e.g., turbo codes) but may be applicable to other iteratively codable codes such as serially concatenated codes and Low Density Parity Check (LDPC) codes.

Coding device 100 may include hardware, software, or both for coding an information sequence u using a parallel coding process, such as a turbo coding process. For example, coding device 100 may include coding device 120, interleaving device 130, coding device 140, and multiplexing device 150. Information sequence u may be, for example, a discrete information sequence $u=\{u[0], u[1], \ldots, u[K-1]\}$ that includes K discrete elements or symbols. In some arrangements, the block size K of the information sequence u may be variable. For example, the block size K may be variable between 40 and 6144 bits for Long Term Evolution (LTE) communications. In another example, the block size K may be variable between 40 and 5114 bits for Universal Mobile Telecommunications System (UMTS) communications.

Coding device 120 may be, for example, a first recursive systematic convolutional (RSC) coder that codes the information sequence u received via communication link 102 to generate the code sequence $(u, p_1)$ at communication link 104, where $p_1$ is a first parity sequence. Coding device 120 may generate the first parity sequence $p_1$ using, for example, a shift register with feedback.

Interleaving device 130 may be, for example, an interleaver that receives and processes the information sequence u to generate the permuted information sequence $u_P$. Information sequence $u_P$ may be, for example, a discrete information sequence $u_P=\{u_P[0], u_P[1], \ldots, u_P[K-1]\}$ that includes K discrete elements or symbols. In an illustrative example in which K=3, the elements $\{u_P[0], u_P[1], u_P[2]\}$ of the permuted information sequence $u_P$ may respectively correspond to the elements $\{u[2], u[0], u[1]\}$ of the information sequence u. Interleaving device 130 may generate the permuted information sequence $u_P$ by, for example, block-by-block interleaving the information sequence u. Interleaving device 130 may then output the permuted information sequence $u_P$ at communication link 106.

Coding device 140 may be, for example, a second RSC coder that codes the permuted information sequence $u_P$ received via communication link 106 to generate a second parity sequence $p_2$ at communication link 108. Coding device 140 may generate the second parity sequence $p_2$ using, for example, a shift register with feedback. In some arrangements, coding device 140 may generate the second parity sequence $p_2$ at communication link 108 by excluding the permuted information sequence $u_P$ from the code sequence $(u_P, p_2)$.

The code sequence $(u, p_1)$ at communication link 104 and the second parity sequence $p_2$ at communication link 108 may be transmitted to multiplexing device 150. Multiplexing device 150 may be, for example, a multiplexer (MUX) that combines the code sequence $(u, p_1)$ and the second parity sequence $p_2$ to generate the code sequence $(u, p_1, p_2)$ at communication link 110. In some arrangements, coding device 100 may include a puncturer for puncturing $p_1$ and $p_2$ to, in some instances, increase the rate of transmission (e.g., from a code rate of 1/3 to a code rate of 1/2).

Coding device 100 may transmit the code sequence $(u, p_1, p_2)$ to another device at communication link 110. Communication link 110 may be, for example, a transmission channel such as an air interface. For example, coding device 100 may modulate the code sequence $(u, p_1, p_2)$ onto a carrier and transmit the modulated code sequence over communication link 110. In some embodiments, coding device 100 may transmit the code sequence $(u, p_1, p_2)$ to a decoding device, such as decoding device 200 shown in FIGS. 2a-2b, via one or more intermediate devices configured to perform rate matching, interleaving and modulation.

Figure 2A:
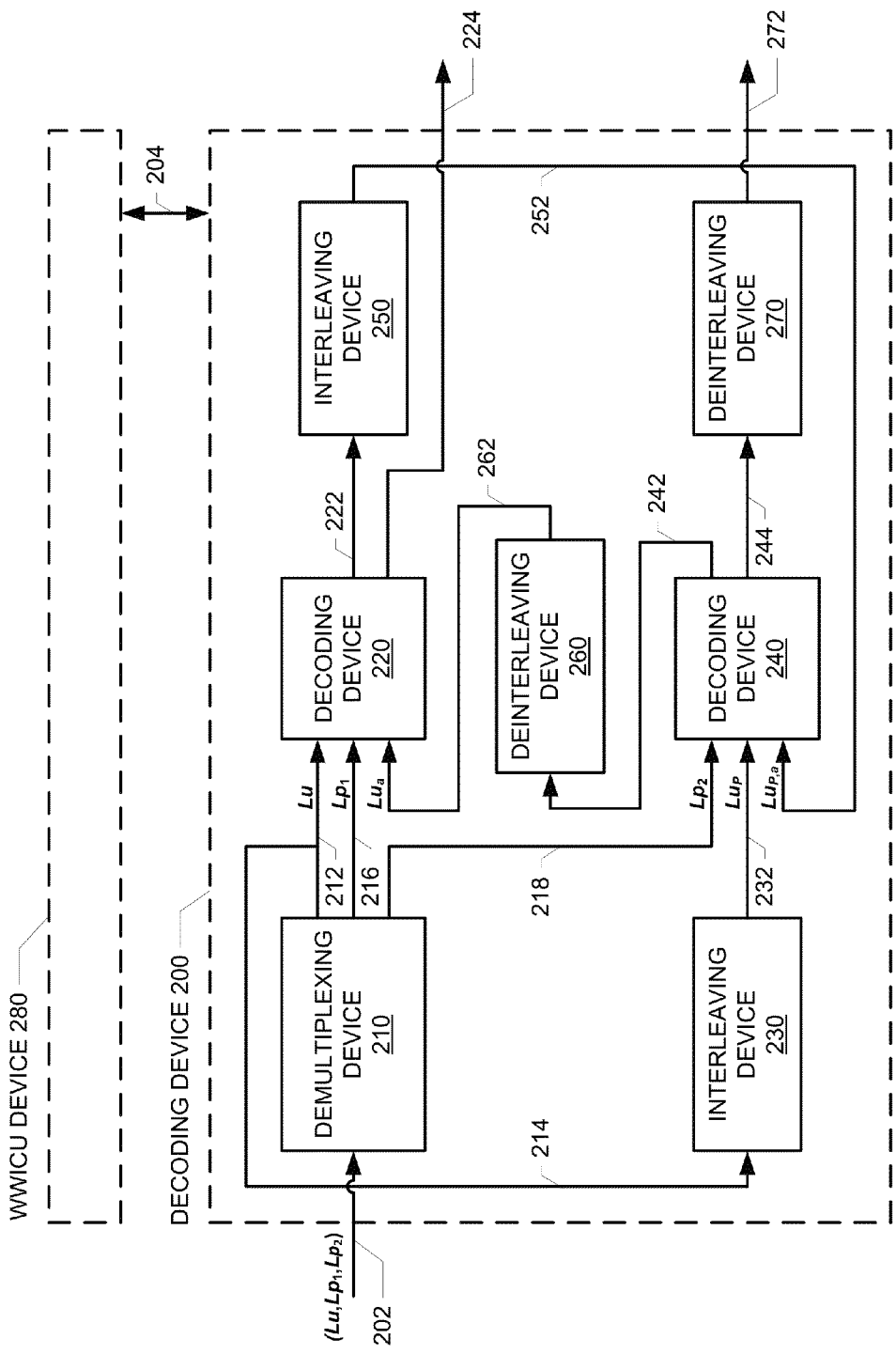
FIGS. 2a-2b illustrate an example decoding system.
Figure 2B:
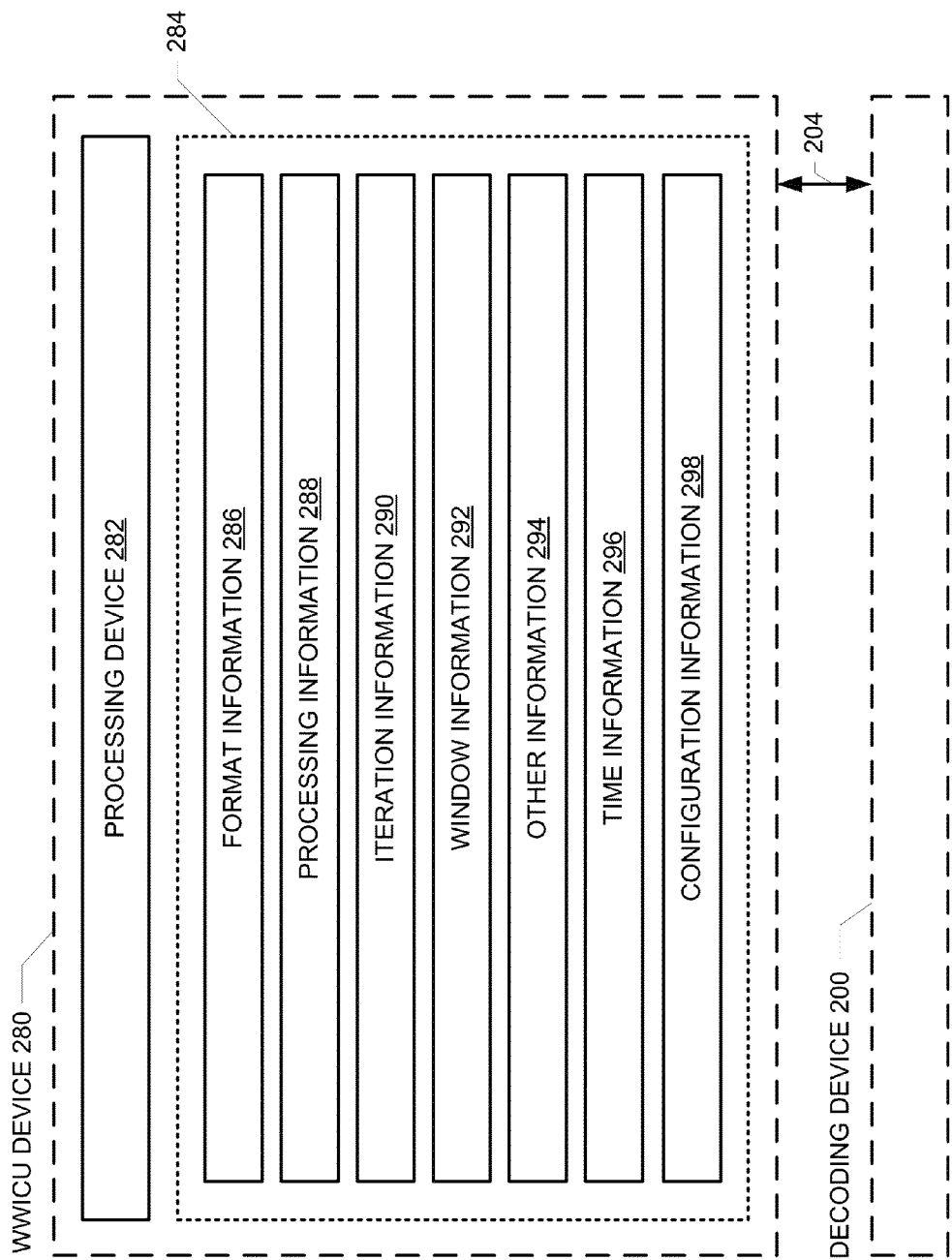

FIGS. 2a-2b illustrate an example system for decoding a received sequence in accordance with one or more aspects described herein. The example system of FIGS. 2a-2b may include decoding device 200 and worker, window-size and iteration control unit (WWICU) device 280. Decoding device 200 may be, for example, a turbo decoder included in or communicatively coupled to a wireless receiver of a computing device. WWICU device 280 may be, a hardware and/or software device for determining configuration parameters for decoding device 200.

In some aspects, the example system of FIGS. 2a-2b or the components described therein may include more or less components than those illustrated in FIGS. 2a-2b. In some aspects, the physical arrangement of the components of the example system of FIGS. 2a-2b may differ from FIGS. 2a-2b. It will be understood that the features described herein are not limited to parallel-concatenated codes (e.g., turbo codes) but may be applicable to other iteratively decodable codes such as serially concatenated codes and Low Density Parity Check (LDPC) codes.

As illustrated in FIG. 2a, decoding device 200 may include hardware, software, or both for decoding a received LLR sequence (Lu, $Lp_1$, $Lp_2$) using an iterative decoding process, such as a turbo decoding process. For example, decoding device 200 may include demultiplexing device 210, decoding devices 220 and 240, interleaving devices 230 and 250, and deinterleaving devices 260 and 270. Received sequence Lu may be, for example, a sequence of real or fixpoint values, such as log-likelihood ratio (LLR) values (i.e., soft bits). For example, received sequence Lu may be a sequence Lu={Lu[0], Lu[1], ..., Lu[K−1]} that includes K LLR values, where K is the code block size. An LLR value may correspond to the logarithm of the ratio between the probability of a logic 0 and the probability of a logic 1, or vice versa. For example, the LLR value of the element Lu[0] may indicate the probability of the element Lu[0] corresponding to either a logic 0 or a logic 1. $Lp_1$ and $Lp_2$ refer to the received LLR-sequences of the first and second bits, respectively.

Decoding device 200 may receive the sequence of LLRs (Lu, $Lp_1$, $Lp_2$) at communication link 202. Communication link 202 may be, for example, a transmission channel such as an air interface. The received sequence of LLRs (Lu, $Lp_1$, $Lp_2$) may be received from, for example, a device such as coding device 100 or an intermediate device communicatively coupled thereto. For example, decoding device 200 may receive a modulated sequence of LLR values at communication link 202 and demodulate the received sequence to generate the received sequence of LLRs (Lu, $Lp_1$, $Lp_2$). The received sequence of LLRs (Lu, $Lp_1$, $Lp_2$) may include, for example, three sequences of LLR values. For example, the LLR values of the received sequences Lu, $Lp_1$, and $Lp_2$ may respectively correspond to the elements of sequences u, $p_1$, and $p_2$ described with reference to FIG. 1.

Decoding device 200 may transmit the received sequence of LLRs (Lu, $Lp_1$, $Lp_2$) to demultiplexing device 210. Demultiplexing device 210 may be, for example, a demultiplexer (DEMUX) that processes the received sequence of LLRs (Lu, $Lp_1$, $Lp_2$) to generate and output the received sequences Lu, $Lp_1$, and $Lp_2$. Demultiplexing device 210 may transmit the received sequences Lu and $Lp_1$ to decoding device 220 at communication links 212 and 216, respectively. Demultiplexing device 210 may transmit the received sequence $Lp_2$ to decoding device 240 at communication link 218.

Demultiplexing device 210 may transmit the received sequence Lu to interleaving device 230 at communication link 214. Interleaving device 230 may be, for example, an interleaver that receives and processes the received sequence Lu to generate the permuted received sequence $Lu_P$. Interleaving device 230 may transmit the permuted received sequence $Lu_P$ to decoding device 240 at communication link 232.

Decoding device 220 may be, for example, a first Soft-In-Soft-Out (SISO) decoder that receives the received sequence Lu at communication link 212, the parity sequence $Lp_1$ at communication link 216, and the a priori sequence $Lu_a$ at communication link 262. Decoding device 220 may process the received sequences Lu, $Lp_1$, and $Lu_a$ to generate an extrinsic sequence at communication link 222 and an a posteriori sequence at communication link 224. In one example, decoding device 220 may process the received sequences Lu, $Lp_1$, and $Lu_a$ using a maximum a posteriori (MAP) technique such as a symbol-by-symbol a posteriori probability (s/s APP) decoding process. In another example, decoding device 220 may process the received sequences Lu, $Lp_1$, and $Lu_a$ using a Soft Output Viterbi Algorithm (SOYA).

The extrinsic sequence output at communication link 222 may include, for example, information generated during a respective half-iteration (e.g., i) and may be indicative of the convergence of the decoding process. A half-iteration corresponds to a decoding step performed by a decoding device (e.g., one of decoding devices 220 and 240), and one iteration includes two half-iterations (e.g., one half-iteration performed by decoding device 220 and one half-iteration performed by decoding device 240). Decoding device 220 may transmit the extrinsic sequence to interleaving device 250 at communication link 222. Interleaving device 250 may be, for example, an interleaver that receives and processes the extrinsic sequence to generate the permuted a priori sequence $Lu_{P,a}$. Interleaving device 230 may transmit the permuted a priori sequence $Lu_{P,a}$ to decoding device 240 at communication link 252, which may be used as a priori information during the subsequent half-iteration (e.g., i+1).

The a posteriori sequence output at communication link 224 may include LLR values corresponding to the information sequence u described with reference to FIG. 1. For example, a computing device may receive the a posteriori sequence output at communication link 224 and determine the binary elements of the information sequence u based on the mathematical signs of the a posteriori LLR values.

Decoding device 240 may be, for example, a second Soft-In-Soft-Out (SISO) decoder that receives the permuted received sequence $Lu_P$ at communication link 232, the parity sequence $Lp_2$ at communication link 218, and the permuted a priori sequence $Lu_{P,a}$ at communication link 252. Decoding device 240 may process the received sequences $Lu_P$, $Lp_2$, and $Lu_{P,a}$ to generate a permuted extrinsic sequence at communication link 242 and a permuted a posteriori sequence at communication link 244. For example, decoding device 240 may process the received sequences $Lu_P$, $Lp_2$, and $Lu_{P,a}$ using a MAP or SOVA technique.

The permuted extrinsic sequence output at communication link 242 may include, for example, information generated during a respective half-iteration and may be indicative of the convergence of the decoding process. Decoding device 240 may transmit the permuted extrinsic sequence to deinterleaving device 260 at communication link 242. Deinterleaving device 260 may be, for example, a deinterleaver that receives and processes the permuted extrinsic sequence to generate the a priori sequence $Lu_a$. Deinterleaving device 260 may transmit the a priori sequence $Lu_a$ to decoding device 220 at communication link 262, which may be used as a priori information during the subsequent half-iteration.

Decoding device 240 may transmit the permuted a posteriori sequence to deinterleaving device 270 at communication link 244. Deinterleaving device 270 may be, for example, a deinterleaver that receives and processes the permuted a posteriori sequence to generate a non-permuted a posteriori sequence. Interleaving device 270 may output the a posteriori sequence at communication link 272.

The a posteriori sequence output at communication link 272 may include LLR values corresponding to the information sequence u described with reference to FIG. 1. For example, a computing device may receive the a posteriori sequence output at communication link 272 and determine the binary elements of the information sequence u based on the mathematical signs of the a posteriori LLR values.

The reliability of the a posteriori sequences output at communication links 224 and 272 may, in some instances, increase with each half-iteration until the decoding process has converged or a predetermined number of iterations has been reached. For example, the magnitude of each of the LLR values of the a posteriori sequences may become greater with each half-iteration.

In certain implementations, decoding device 200 may include only one physical decoding device. For example, decoding device 200 may include decoding device 220 but not decoding device 240. As a result, decoding device 220 may be configured to perform the features described with reference to both of devices 220 and 240. For example, decoding device 220 may operate on the respective non-permuted and permuted sequences using a time-multiplexed and subsequent technique.

In certain implementations, the decoding process implemented by decoding device 200 may be a parallel decoding process that utilizes parallel processing devices. These processing devices may be referred to herein as workers or parallel workers. For example, a parallel decoding process may be used in which a first code block containing the LLR values of the received sequence Lu and a second code block containing the permuted LLR values of the permuted received sequence $Lu_P$ may be divided into multiple sub-blocks (e.g., sequences of length $K_{sub}$<K, where $K_{sub}$ represents the number of LLR values in the sub-block). The sub-blocks may be stored in one or more memory devices and decoded in parallel using multiple processing devices. For example, decoding device 220, decoding device 240, or both may process the sub-blocks in parallel using a configurable number of parallel workers.

In some embodiments, decoding device 200 may receive multiple data packets corresponding to multiple different formats at communication link 202 due to Multiple-Input Multiple-Output (MIMO) processing or multi-cell operation. A format may include, for example, the number of payload bits and, if the number of payload bits is variable, the cyclic redundancy check (CRC) length. As a result, multiple data packets corresponding to multiple different formats may require processing during a given time interval. In some instances, decoding device 200 may receive data packets corresponding to formats such as Long Term Evolution (LTE), High-Speed Downlink Packet Access (HSDPA), Time Division Synchronous Code Division Multiple Access (TD-SCDMA), or any other format where iterative decoding processes are used. In an illustrative example, decoding device 200 may receive an HSDPA data packet and an LTE data packet and process the received HSDPA and LTE data packets sequentially (e.g., by first processing the HSDPA data packet and subsequently processing the LTE data packet).

Decoding device 200 may determine the code block size (or sizes) and the number of code blocks of the received data packets using techniques associated with the air interface standard that corresponds to the format of the data packet. In some instances, the formats for each time interval may be signaled to the user equipment (UE) and not directly to decoding device 200. Other aspects of a format, such as the modulation alphabet and the number of bits available for transmission on the air-interface, may not be relevant for the processing time of decoding device 200 but may still have an impact of the overall execution time including hybrid automatic repeat request (ARQ) processing.

Decoding device 200 may be configurable to adjust its processing time and, as a result, its performance (e.g., user-Tput, BLER). For example, decoding device 200 may be configurable to allow setting of its configuration parameters by WWICU 280, which may be communicatively coupled to decoding device 200 at communication link 204. The configuration parameters of decoding device 200 may include, for example, the number of half-iterations and the window size. If the iterative decoding process is a parallel decoding process, the configuration parameters may also include the number of parallel workers of one or both of decoding devices 220 and 240.

WWICU 280 may determine configuration information for configuring the operating parameters of decoding device 200, such as the window size and/or the number of half-iterations to be used for each of the multiple data packets. In cases where a parallel decoding process is used, WWICU 280 may determine the number of parallel workers (e.g., one or more workers) to be used for each of the multiple data packets. For example, the multiple data packets corresponding to the multiple different formats may vary in size and, as a result, the speed of decoding device 200 may be adjusted for each data packet based on configuration parameters determined by WWICU 280 for each data packet. Using the configuration parameters determined by WWICU 280, the decoding device 200 may be able to process the instantaneous formats using a technique that makes use of the available decoding time in an adaptive and optimum manner that may result, in some instances, in a decreased BLER (or increased user-Tput) compared to a non-adaptive, worst-case setting of the configuration parameters.

In some arrangements, WWICU 280 may optimize the total cycle count for the multiple data packets corresponding to the multiple different formats. For example, each of the data packets may be associated with a maximum decoding time in which that data packet must be decoded. If the data packet is large, WWICU 280 may increase the speed of decoding device 200. If the data packet is small, WWICU 280 may decrease the speed of decoding device 200, which may allow for an increased number of half-iterations or a smaller number of parallel workers (if a parallel decoding process is used), both of which may improve the performance (e.g., user-Tput, BLER) of decoding device 200. Accordingly, WWICU 280 may adjust the number of half-iterations, the window size, and the number of parallel workers (if a parallel decoding process is used) to improve the performance of decoding device 200 by optimizing its speed to match the maximum decoding time.

As illustrated in FIG. 2b, WWICU device 280 may include hardware, software, or both for configuring the parameters of decoding device 200. For example, WWICU 280 may include a processing device 282 and a storage device 284. Storage device 284 may include, for example, format information 286, processing information 288, iteration information 290, window information 292, other information 294, time information 296, and configuration information 298.

Format information 286 may include, for example, information indicative of one or more formats to be processed by the decoding process. For example, format information 286 may include information indicative of the number of formats M to be processed in a particular subframe, where M is an integer value equal to or greater than one. In another example, format information 286 may include information indicative of the format $F_i$ corresponding to the i-th format of the M formats to be processed, where i is an integer value between one and M.

Processing information 288 may include, for example, information indicative of a number of parallel workers to be used in the decoding process. For example, processing information 288 may include the number of parallel workers $P_i$ corresponding to the i-th format of the M formats to be processed. The number of parallel workers $P_i$ may be, for example, an integer value between one and a maximum number of parallel workers $P_{max}$ supported by decoding device 200. In some instances, the number of parallel workers $P_i$ may be configurable by WWICU 280 in increments of powers of two (e.g., 1, 2, 4, 8, 16, ... $P_{max}$). In some instances, for a given format, the number of parallel workers may be determined differently for MAP1 (e.g., which processes the non-interleaved data stream) and MAP2 (e.g., which processes the interleaved data stream).

Iteration information 290 may include, for example, information indicative of a number of half-iterations to be used in the decoding process. For example, iteration information 290 may include the number of half-iterations $I_i$ corresponding to the i-th format of the M formats to be processed. The number of half-iterations $I_i$ may be, for example, an integer value between one and a maximum number of half-iterations $I_{max}$ supported by decoding device 200. In some instances, the number of half-iterations $I_i$ may be configurable by WWICU 280 in increments of one half-iteration (e.g., 1, 2, 3, 4, 5, ... $I_{max}$).

Window information 292 may include, for example, information indicative of a window size to be used in the decoding process. For example, window information 292 may include the window size $W_i$ corresponding to the i-th format of the M formats to be processed. The window size $W_i$ may be, for example, an integer value between a base window size $W_{base}$ and a maximum window size $W_{max}$ supported by decoding device 200. In some instances, the window size $W_i$ may be configurable by WWICU 280 in increments of multiples of the base window size (e.g., $1 \times W_{base}$, $2 \times W_{base}$, $3 \times W_{base}$, $4 \times W_{base}$, $5 \times W_{base}$, ... $W_{max}$).

Other information 294 may include, for example, information indicative of a code block size and a number of code blocks to be used in the decoding process. For example, other information 294 may include the code block size $K_i$ and the number of code blocks $C_i$ corresponding to the i-th format of the M formats to be processed. In some instances, other information 294 may include additional information associated with the decoding process, decoding device 200, transmitter 100, or any other component, process, or technique.

Time information 296 may include, for example, information indicative of a processing time of the decoding process. For example, time information 296 may include the cycle count $N_i$ for the i-th format of the one or more formats to be processed, where i is an integer value between one and M. In another example, time information 296 may include the total cycle count N for all of the formats to be processed. The cycle count $N_i$ and the total cycle count N may each be integer values in units of hardware (HW) cycles.

The cycle count $N_i$ of the i-th format of the M formats to be processed may be a function of the number of parallel workers $P_i$, the number of half-iterations $I_i$, the window size the code block size $K_i$, and the number of code blocks $C_i$. In an illustrative example (e.g., without acquisition of recursions), WWICU 280 may determine (e.g., using processing device 282) the cycle count $N_i$ of the i-th format of the M formats to be processed as shown in Equation 1:

$$N_i = C_i I_i \left( a + W_i + \frac{K_i}{P_i} \right) \tag{1}$$

where a is a constant representative of fixed latencies of the decoding process. Subsequently, WWICU 280 may determine the total cycle count N for all of the M formats as shown in Equation 2:

$$N = \sum_{i=1}^{M} N_i \tag{2}$$

If a different number of parallel workers is used for MAP1 and MAP2, Equation 2 may be generalized as shown in Equation 3:

$$N_i = C_i \sum_{l=1}^{2} \frac{I_i}{2} \left( a + W_i + \frac{K_i}{P_i^{(l)}} \right) \tag{3}$$

where $P_i^{(l)}$ denotes the number of parallel workers of the i-th format for MAP l, where l=1,2.

In some instances, WWICU 280 may optimize the configuration of decoding device 220 by determining the optimum value of the total cycle count N. For example, WWICU 280 may determine the values of $P_i$, $I_i$, and $W_i$ that maximize the total cycle count N but keep it below a threshold value $N_{max}$. The threshold value $N_{max}$ may be, for example, a maximum total cycle count based on the latency requirements of the parallel decoding process. In one example, WWICU 280 may optimize the configuration of decoding device 220 as shown in Equation 4:

$$\underset{\vec{I}, \vec{P}, \vec{W}}{\arg\max} N \leq N_{max} \tag{4}$$

where the maximization of N is based on a vector of half-iterations $\vec{I}$, a vector of parallel workers $\vec{P}$, and a vector of window sizes $\vec{W}$ corresponding to each of the M formats to be processed.

Configuration information 298 may include, for example, information indicative of one or more configurable parameters to be used in the decoding process. For example, configuration information 298 may include the number of parallel workers $P_i$, the number of half-iterations $I_i$, and the window size $W_i$ corresponding each of the M formats to be processed by decoding device 200. In some instances, WWICU 280 may transmit configuration information 298 to decoding device 200 at communication link 204. Subsequently, decoding device 200 may be configurable to perform the decoding process based on configuration information 298 received from WWICU 280 at communication link 204.

In some embodiments, WWICU 280 may use the format of the transport block to pre-evaluate the processing time. WWICU 280 may store or have access to the maximum processing time and, based on the maximum processing time, optimize the configuration of the parallel turbo decoder. For example, WWICU 280 may select the configuration that best allows the decoding device 200 to meet the throughput requirements. In an illustrative example, WWICU 280 may use a starting configuration, such as a minimum number of parallel workers, a maximum number of half-iterations, and a maximum window-size for the particular code rates. WWICU 280 may determine the processing time for the starting configuration and compare it against the maximum processing time to determine if it will meet the throughput requirements. If the processing time meets the throughput requirements, WWICU 280 may program (or transmit instructions to) decoding device 200 according to the starting configuration. Otherwise, WWICU 280 may modify the parameters and determine the processing time for the modified configuration. For example, WWICU 280 may increase the number of parallel workers and reduce the number of half-iterations, respectively, in a pre-defined order and re-compute the processing time iteratively until the throughput requirements are met.

In some embodiments, WWICU 280 may determine configuration information 298 based on format information 286, based on a database of configuration information (e.g., a data structure stored in memory, a look-u$_p$ table, a map), or based on a combination of the methods described herein. Determining configuration information based on a database of configuration information will be discussed in further detail with reference to FIG. 3.

FIG. 3 illustrates example information 300 for use in configuring a decoding device, such as decoding device 200. In some embodiments, information 300 may be included in a database of configuration information. For example, information 300 may be a data structure stored in a memory (e.g., storage device 284) of WWICU 280. In certain implementations, information 300 may be stored remotely in a storage device communicatively coupled to WWICU 280. In some embodiments, information 300 may be included in a user interface displayed on a user device (e.g., a personal computer, laptop, tablet computer, mobile phone, wireless device).

Information 300 may include configuration information for a plurality of formats F, each associated with a respective format information field 320, processing information field 322, iteration information field 324, window information field 326, and other information field 328. Configuration information for n respective formats or combinations of formats may be included in configuration information rows 302, 304, 306, 308, and 310, and in any other row, field, grouping, data structure, and combination thereof. The value n may be an integer value that represents the number of different formats or combinations of formats included in information 300.

In some embodiments, information 300 may include pre-determined configuration information stored in association with a particular format or combination of formats. For example, configuration information in row 302 may correspond to pre-determined configuration information $P_1$, $I_1$, $W_1$, $K_1$, and $C_1$ for a first format $F_1$, such as an LTE format. In another example, configuration information in row 304 may correspond to pre-determined configuration information $P_2$, $I_2$, $W_2$, $K_2$, and $C_2$ for a second format $F_2$, such as an HSDPA format. In another example, configuration information in row 306 may correspond to pre-determined configuration information $P_3$, $I_3$, $W_3$, $K_3$, and $C_3$ for a combination of formats $F_3$ to be processed within a given time unit (e.g., due to MIMO processing or multi-cell operation).

In some embodiments, information 300 may be dynamically updated to add, edit, or remove configuration information associated with a particular format. For example, configuration information in row 308 may be added to information 300 by WWICU 280 in response to determining processing information 288, iteration information 290, window information 292, other information 294, and configuration information 384. For example, configuration information in row 308 may correspond to a combination of M formats $F_4$ stored in association with configuration information $P_4$, $I_4$, $W_4$, $K_4$, and $C_4$ determined by WWICU 280 in accordance with Equations 1-3.

Figure 4:
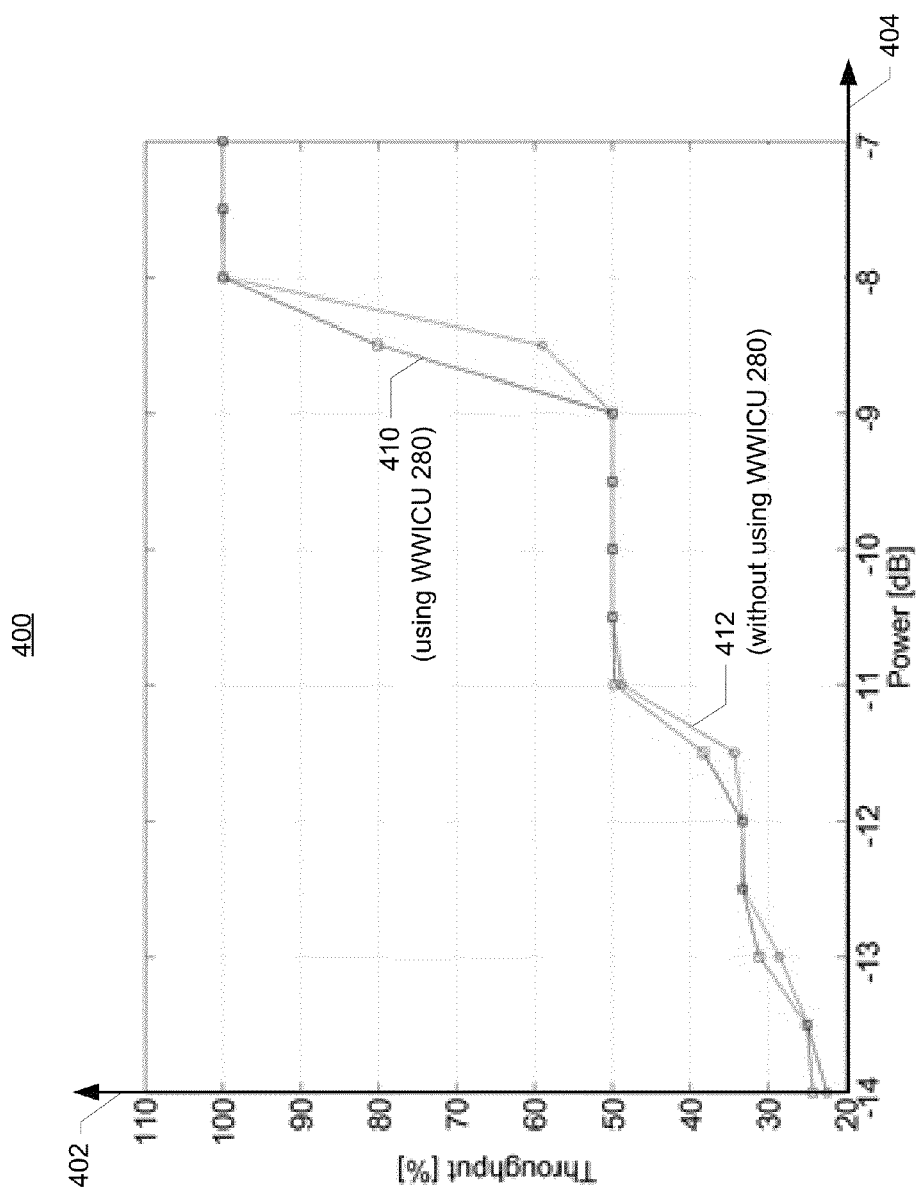
FIG. 4 illustrates an example graph showing the performance of a decoding device.

FIG. 4 illustrates an example graph 400 showing the performance of a decoding device. Graph 400 includes a first axis 402 (e.g., Throughput [%]) and a second axis 404 (e.g., Power [dB]). The first axis 402 refers to the user-Tput (e.g., the number of data packets successfully received from decoding device 200 per time unit) of a device such as decoding device 200. The second axis 404 refers to the received chip energy versus the total received power density of the base station for an HSDPA data channel. An additive white Gaussian noise (AWGN) channel was used for the simulation illustrated by graph 400.

As illustrated in FIG. 4, the impact of WWICU 280 is indicated by curve 410. Curve 410 illustrates a case where WWICU 280 was used to configure decoding device 200 in response to determining the number of parallel workers P and the number of half-iterations I for a single-stream decoding process in accordance with the discussion of FIG. 2b. Curve 412 illustrates a case where WWICU 280 was not used to configure decoding device 200. Rather, the configuration parameters were chosen to be fixed such that the worst-case formats of a given data rate category still met the real-time decoding latency requirement. Curve 410 shows one way in which the use of WWICU 280 may increase the user-Tput of decoding device 200 (e.g., by configuring the number of parallel workers and the number of half-iterations of decoding device 220). In some instances, an early stopping rule may be used to reduce the power consumption of decoding device 200.

Figure 5:
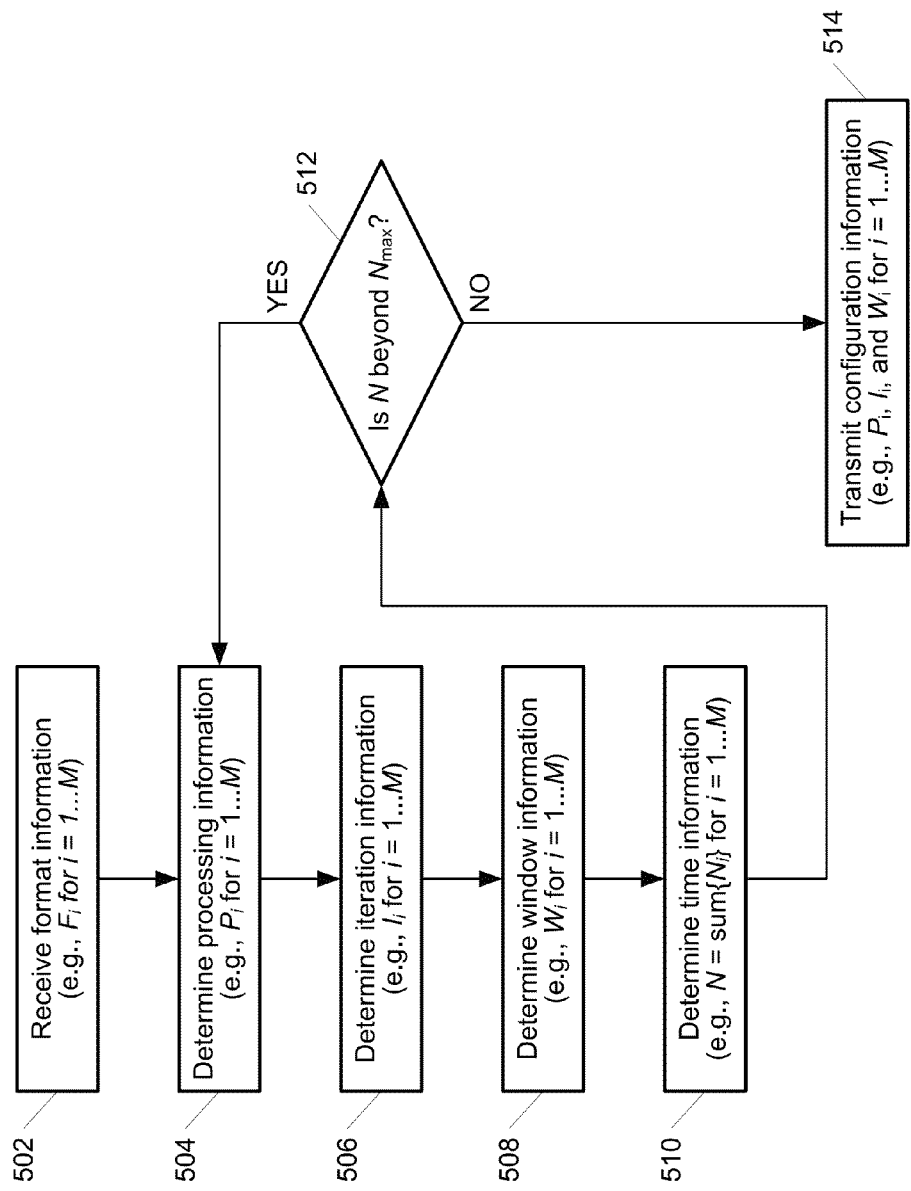
FIG. 5 illustrates an example process flow for configuring a decoding device.

FIG. 5 illustrates an example process flow for configuring a decoding device (e.g., decoding device 200) using a control device (e.g., WWICU 280). Some aspects of the example process flow may include aspects described with reference to FIGS. 2a-2b. Also, while the steps discussed with regard to FIG. 5 will reference to the example system of FIGS. 2a-2b, this is only an example; these or similar steps may also be performed on variations of that system.

At step 502, a control device (e.g., WWICU 280) receives format information. The format information may be indicative of one or more formats to be processed by the decoding process described herein. The format information may include, for example, information indicative of the format $F_i$ corresponding to the i-th format of the M formats to be processed, where i is an integer value between one and M. For example, the format information may include information described with reference to format information 286.

At step 504, the control device determines processing information. The processing information may include, for example, a number of parallel workers $P_i$ to be used in the decoding process for each of the one or more formats. For example, the processing information may include information described with reference to processing information 288.

At step 506, the control device determines iteration information. The iteration information may include, for example, a number of half-iterations h to be used in the decoding process for each of the one or more formats. For example, the iteration information may include information described with reference to iteration information 290.

At step 508, the control device determines window information. The window information may include, for example, a window size $W_i$ to be used in the decoding process for each of the one or more formats. For example, the window information may include information described with reference to window information 292.

At step 510, the control device determines time information. The time information may include, for example, a cycle count $N_i$ for each of the one or more formats and a total cycle count N corresponding to a sum of the cycle counts $N_i$. For example, the time information may include information described with reference to time information 296.

At step 512, the control device determines whether the total cycle count is beyond a threshold value. For example, the control device may determine whether the total cycle count N is less than or equal to a threshold value $N_{max}$ as described with reference to FIG. 2b. If the total cycle count is not beyond the threshold value, the process may proceed to step 514. If the total cycle count is beyond the threshold value, the process may proceed to step 504 and repeat using different values of P, I, and W. For example, the control device may iteratively increase the number of parallel workers at step 504, reduce the number of half-iterations at step 506, and re-compute the total cycle count at step 510 until it is less than or equal to the threshold value.

At step 514, the control device transmits configuration information to a decoding device (e.g., decoding device 200) configurable to perform the decoding process based on the configuration information. The configuration information may include, for example, the processing information, the iteration information, and the window information. For example, the configuration information may include information described with reference to configuration information 298.

Figure 6:
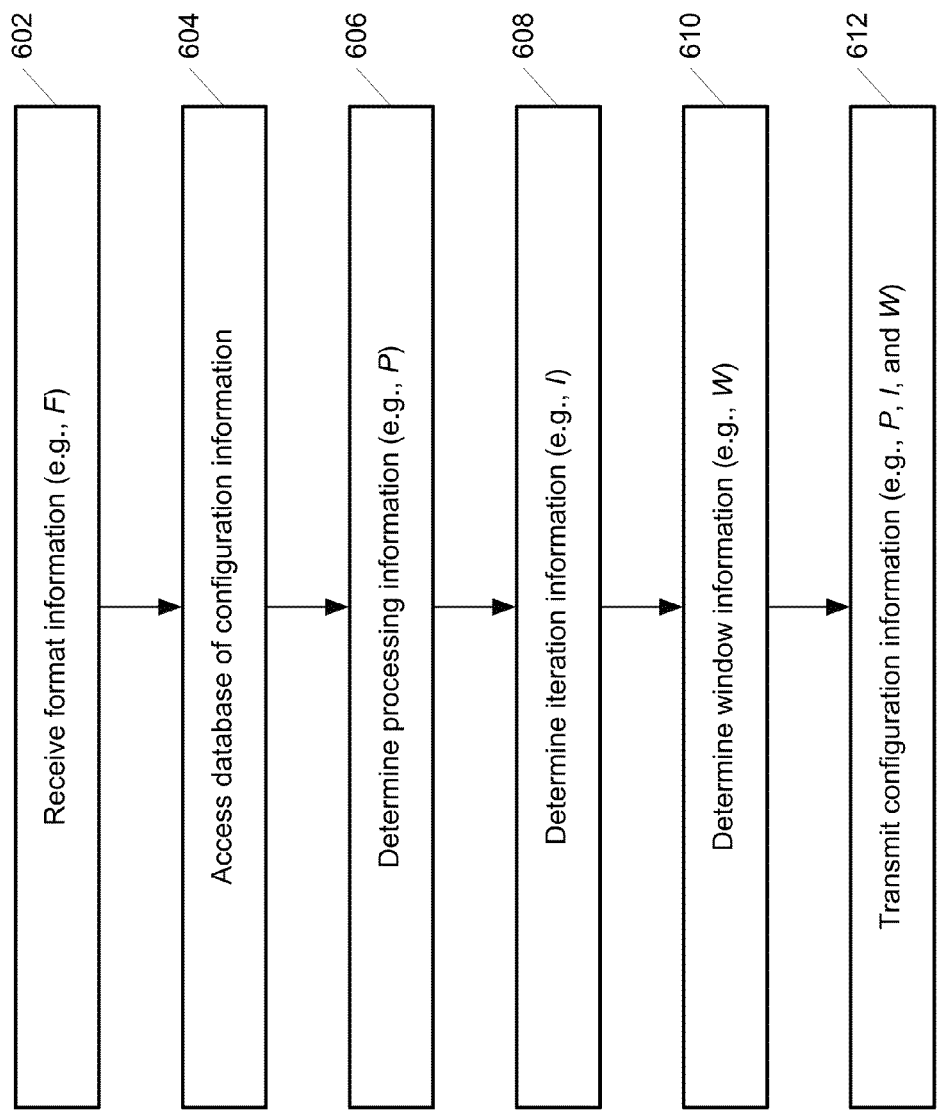
FIG. 6 illustrates another example process flow for configuring a decoding device.

FIG. 6 illustrates another example process flow for configuring a decoding device (e.g., decoding device 200) using a control device (e.g., WWICU 280). Some aspects of the example process flow may include aspects described with reference to FIGS. 2-3. Also, while the steps discussed with regard to FIG. 6 will reference to the example systems of FIGS. 2-3, this is only an example; these or similar steps may also be performed on variations of that system.

At step 602, a control device (e.g., WWICU 280) receives format information. The format information may be indicative of a format F (e.g., a single format or a combination of formats) to be processed by the decoding process described herein. For example, the format information may include information described with reference to format information 320.

At step 604, the control device may access a database of configuration information. For example, the control device may access a database of configuration information that includes information 300.

At step 606, the control device determines processing information. The processing information may include, for example, a number of parallel workers P corresponding to the format F to be processed by the decoding process. For example, the processing information may include information described with reference to processing information 322.

At step 608, the control device determines iteration information. The iteration information may include, for example, a number of half-iterations I corresponding to the format F to be processed by the decoding process. For example, the iteration information may include information described with reference to iteration information 324.

At step 610, the control device determines window information. The window information may include, for example, a window size W corresponding to the format F to be processed by the decoding process. For example, the window information may include information described with reference to window information 326.

At step 612, the control device transmits configuration information to a decoding device (e.g., decoding device 200) configurable to perform the decoding process based on the configuration information. The configuration information may include, for example, the processing information, the iteration information, and the window information. For example, the configuration information may include information described with reference to configuration information 328.

Thus, various examples have been described in which configuration information for configuring a decoding device, such as decoding device 200, may be determined using a control device, such as WWICU 280. As a result, the performance (e.g., user-Tput, BLER) of the decoding device may be improved for increasing values of $I_i$ and $W_i$ and, if the decoding device uses a parallel decoding process, for decreasing values of $P_i$. Alternatively, a simple iteration control may be used that limits the number of half-iterations for data packets that cannot meet the decoding device 200's throughput requirement (e.g., the inverse of the decoding latency, the inverse of the number of hardware cycles needed for the decoding process) with the default iteration setting.

While various embodiments have been illustrated and described, there are merely examples. The words used in this specification are words of description rather than limitation, and it is understood that various changes may be made without departing from the spirit and scope of the present disclosure.

The invention claimed is:

1. A device, comprising:
   a processor; and
   a non-transitory memory operatively coupled to the processor and storing computer readable instructions that, when executed by the processor, cause the device to:
   determine iteration information based on format information indicative of one or more formats to be processed by a decoding process, wherein the iteration information includes a number of half-iterations to be used in the decoding process;
   determine window information based on the format information, wherein the window information includes a window size to be used in the decoding process;
   determine time information based on the iteration information and the window information, wherein the time information includes a total cycle count; and
   transmit configuration information to a decoding device configurable to perform the decoding process based on the configuration information, wherein the configuration information includes the iteration information and the window information.

2. The device of claim 1, wherein the non-transitory memory further stores computer readable instructions that, when executed by the processor, cause the device to:
   determine processing information based on the format information, wherein the processing information includes a number of parallel workers to be used in the decoding process; and
   determine the time information based on the processing information, the iteration information, and the window information,
   wherein the configuration information further includes the processing information.

3. The device of claim 1, wherein the non-transitory memory further stores computer readable instructions that, when executed by the processor, cause the device to:
   determine whether the total cycle count is beyond a threshold value; and
   in response to determining that the total cycle count is not beyond the threshold value, transmit the configuration information to the decoding device.

4. The device of claim 3, wherein the non-transitory memory further stores computer readable instructions that, when executed by the processor, cause the device to:
   in response to determining that the total cycle count is beyond the threshold value,
   iteratively decrease the number of half-iterations, and
   iteratively determine the total cycle count until the total cycle count is less than or equal to the threshold value.

5. The device of claim 1, wherein the non-transitory memory further stores computer readable instructions that, when executed by the processor, cause the device to:
determine the total cycle count by determining a sum of one or more cycle counts corresponding to each of the one or more formats.

6. The device of claim 1, wherein the configuration information includes instructions that, when executed by the decoding device, cause the decoding device to be configured in accordance with the configuration information.

7. The device of claim 6, wherein the non-transitory memory further stores computer readable instructions that, when executed by the processor, cause the device to:
update a database of configuration information based on the configuration information by storing the configuration information in association with the one or more formats.

8. The device of claim 6, wherein the one or more formats are based on multiple stream reception, and wherein the one or more formats include one or more of a Long Term Evolution (LTE) format, a High-Speed Downlink Packet Access (HSDPA) format, and a Time Division Synchronous Code Division Multiple Access (TD-SCDMA) format.

9. A device, comprising:
a processor; and
a non-transitory memory operatively coupled to the processor and storing computer readable instructions that, when executed by the processor, cause the device to:
receive format information corresponding to a format to be processed by a decoding process;
determine a number of half-iterations to be used in the decoding process based on a database of configuration information, wherein the database of configuration information includes the format stored in association with the number of half-iterations;
determine a window size to be used in the decoding process based on the database of configuration information, wherein the database of configuration information includes the format stored in association with the window size; and
transmit configuration information to a decoding device configurable to perform the decoding process based on the configuration information, wherein the configuration information includes the number of half-iterations and the window size.

10. The device of claim 9, wherein the decoding process is an iterative decoding process.

11. The device of claim 9, wherein the format is a Long Term Evolution (LTE) format.

12. The device of claim 9, wherein the format is a High-Speed Downlink Packet Access (HSDPA) format.

13. The device of claim 9, wherein the format is a Time Division Synchronous Code Division Multiple Access (TD-SCDMA) format.

14. The device of claim 9, wherein the configuration information includes instructions that, when executed by the decoding device, cause the decoding device to be configured in accordance with the configuration information.

15. The device of claim 9, wherein the non-transitory memory further stores computer readable instructions that, when executed by the processor, cause the device to:
update the database of configuration information.

16. The device of claim 9, wherein the non-transitory memory further stores computer readable instructions that, when executed by the processor, cause the device to:
determine a number of parallel workers to be used in the decoding process based on the database of configuration information, wherein the database of configuration information includes the format stored in association with the number of parallel workers,
wherein the configuration information further includes the number of parallel workers.

17. A method comprising:
determining, by a first device, iteration information based on format information indicative of one or more formats to be processed by a decoding process, wherein the iteration information includes a number of half-iterations to be used in the decoding process;
determining, by the first device, window information based on the format information, wherein the window information includes a window size to be used in the decoding process;
determining, by the first device, time information based on the iteration information and the window information, wherein the time information includes a total cycle count; and
transmitting, by the first device, configuration information to a second device configurable to perform the decoding process based on the configuration information, wherein the configuration information includes the iteration information and the window information.

18. The method of claim 17, wherein the decoding process is a turbo decoding process, and wherein the second device is a turbo decoding device.

19. The method of claim 17, further comprising:
determining, by the first device, processing information based on the format information, wherein the processing information includes a number of parallel workers to be used in the decoding process; and
determining, by the first device, the time information based on the processing information, the iteration information, and the window information,
wherein the configuration information further includes the processing information.

20. The method of claim 19, further comprising:
determining, by the first device, whether the total cycle count is beyond a threshold value;
in response to determining that the total cycle count is not beyond the threshold value, transmitting the configuration information to the second device; and
in response to determining that the total cycle count is beyond the threshold value, iteratively increasing, by the first device, the number of parallel workers,
iteratively decreasing, by the first device, the number of half-iterations, and
iteratively determining, by the first device, the total cycle count until the total cycle count is less than or equal to the threshold value.

* * * * *